United States Patent [19]

Gesper et al.

[11] Patent Number: 5,107,245
[45] Date of Patent: Apr. 21, 1992

[54] CONTROL ARRANGEMENT FOR AN OCCUPANT RESTRAINT SYSTEM OF AN AUTOMOBILE

[75] Inventors: Christoph Gesper, Walzbachtal; Siegfried Heyden, Pforzheim, both of Fed. Rep. of Germany

[73] Assignee: Becker Autoradiowerk GmbH, Karlsbad, Fed. Rep. of Germany

[21] Appl. No.: 544,515

[22] Filed: Jun. 27, 1990

[30] Foreign Application Priority Data

Jul. 25, 1989 [DE] Fed. Rep. of Germany ....... 3924595

[51] Int. Cl.⁵ .............................................. B60R 21/00
[52] U.S. Cl. .................................. 340/436; 280/735; 364/424.05
[58] Field of Search ............... 340/436, 438; 280/734, 280/735; 307/10.1; 364/424.05

[56] References Cited

U.S. PATENT DOCUMENTS

| | | | |
|---|---|---|---|
| 4,087,782 | 5/1978 | Oishi et al. | 280/735 X |
| 4,410,875 | 10/1983 | Spies et al. | 280/735 X |
| 4,864,202 | 9/1989 | Nitschke et al. | 307/10.1 X |

Primary Examiner—Jin F. Ng
Assistant Examiner—Brian R. Tumm
Attorney, Agent, or Firm—Sixbey, Friedman, Leedom & Ferguson

[57] ABSTRACT

The function of a control arrangement for an occupant restraint system in an automobile is continuously monitored by monitoring circuit. The monitoring circuit checks the frequency of a check signal derived from the microcomputer clock signal using a counting device which is controlled by its own stable oscillator. The monitoring circuit supplies an enable signal to the microcomputer, when such frequency is correct. If the frequency of the check signal is not found to be correct the monitoring circuit supplies a drive signal for the operation of an indicating lamp. At the same time the supply of the trip signal to the trip device is prevented. An error message is produced and the trip signal is suppressed also if the monitoring circuit itself fails.

9 Claims, 1 Drawing Sheet

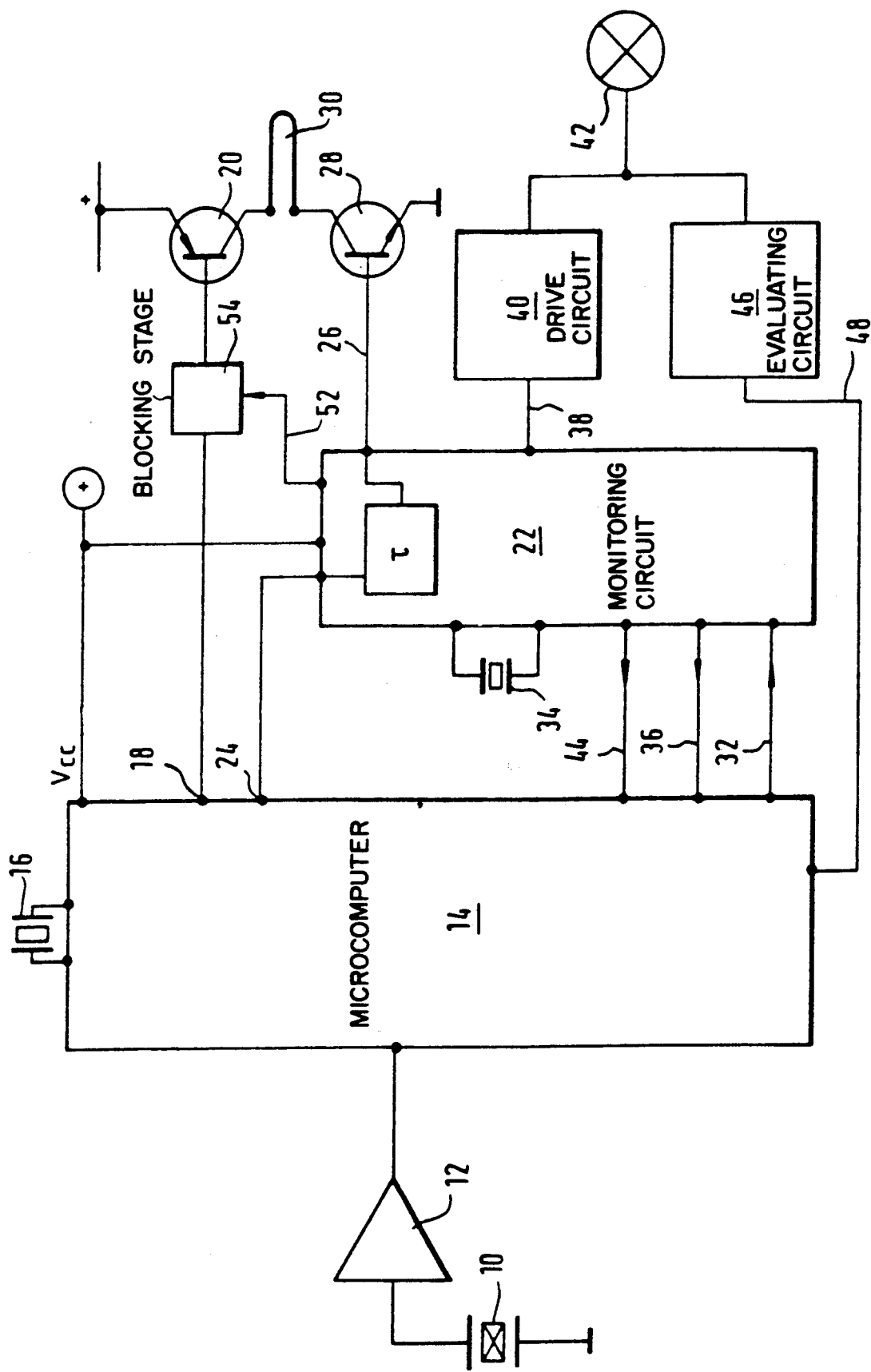

CONTROL ARRANGEMENT FOR AN OCCUPANT RESTRAINT SYSTEM OF AN AUTOMOBILE

BACKGROUND OF THE INVENTION

The invention relates to a control arrangement for an automobile occupant restraint system, comprising a microcomputer for processing acceleration signals provided by an acceleration pickup, and for supplying a trip signal to a trip device of the occupant restraint system, when the outcome the processed acceleration signals fulfill a criterion for activation of the occupant restrain system.

A similar control device is described in German patent 3,001,780, in which the microcomputer continuously monitors the acceleration signal supplied from the acceleration pickup and evaluates it in order, if appropriate, to send a trip signal to the trip device of the occupant restraint system. The occupant restraint system may be one of the airbag type or a safety belt type system with a belt pretensioning device.

Such control arrangements have to conform to extremely stringent requirements relating to functional security and reliability. It is just as necessary to ensure a proper activation as it is to preclude a spurious one. Since a microcomputer is required for the complex task of signal processing and determining the optimum points in time for tripping, the control arrangement contains a component essential for its operation which, owing to the operating conditions of an automobile, may be subject to a wide variety of interfering factors. There is thus a need for a monitoring arrangement which monitors the functioning of the microcomputer, and the operating factors necessary for its satisfactory operation, with the highest possible degree of reliability.

SHORT SUMMARY OF THE INVENTION.

One object of the present invention is to devise a monitoring circuit fulfilling these requirements.

More particularly, a further object of the invention is to provide a control arrangement of the initially described type having a monitoring circuit which reliably detects every relevant malfunction so as to prevent spurious activation of the occupant restraint system.

These or other objects are to be attained by a monitoring circuit external to the microcomputer which by means of a counting device, controlled by its own stable oscillator, monitors the frequency of a check signal derived from the microcomputer clock, and provides an enable signal when the check signal reaches the correct frequency. The circuit activates an indicating device when the check signal is found not to be correct and, responding to the enable signal, prevents passing on of the trip signal to the activating device, when the check signal is found not to be correct. The invention is based on the realization that an important criterion for satisfactory operation of the microcomputer is that its clock signal keep to the prescribed frequency.

However the checking of the clock frequency as a criterion for the satisfactory operation of a microcomputer in a control arrangement for occupant restraint systems is problematical, because it has to take place in a very short period of time, which in the extreme is between the output of a trip signal by the microcomputer and its transfer to the activating device of the occupant restraint system. When the microcomputer supplies a trip signal a check has to be performed within a time, which is small in relation to the time for the activation of the occupant restraint system, to see if whether the microcomputer is operating correctly. Therefore, it is more especially necessary to check the microcomputer clock frequency. This may be done with counting circuits or timer circuits. For the operation of such circuits it is however again necessary to have a clock signal available. Without an external, stable clock signal it is thus not possible to perform any check of the clock frequency of the microcomputer clock signal. Therefore, in accordance with the invention, the monitoring circuit is equipped with its own, stable oscillator. It is then not only possible to monitor the clock signal of the microcomputer, but also the function of the monitoring circuit itself. If in fact the oscillator of the monitoring circuit should operate defectively, the evaluation of even a correct microcomputer clock signal will lead to an incorrect result, because the reference quantity used for frequency measurement is faulty.

A particular feature of the control arrangement in accordance with the invention is that even the simultaneous occurrence of two faults, that is to say one fault in connection with the microcomputer and one fault in connection with the monitoring circuit itself, will not lead to spurious activation.

In a preferred embodiment of the control arrangement, the trip device only responds to the simultaneous occurrence of two trip signals, one of which is directly supplied by the microcomputer via the blocking stage, which is under the control of the monitoring circuit, while the other signal is delayed in the monitoring circuit for a time which suffices for the checking of the clock signal of the microcomputer. This time is in the order of some hundred μs and is sufficiently short in relation to the activating time of the occupant restraint system. Since the monitoring circuit is only able to detect microcomputer functioning after the elapse of a certain time needed for evaluation, a trip signal provided by the microcomputer is delayed in the monitoring circuit and only passed on to the trip device, if no error is detected in the delay time. This design means that spurious tripping will be prevented even if a fault occurs within a very short time directly preceding the output of trip signal, such time not sufficing for the recognition of a fault by the monitoring circuit. In the majority of cases involving faults, the absence of the enable signal produced in the monitoring circuit means that a trip signal from the microcomputer is suppressed and stopped in the blocking stage.

A particularly simple evaluation of the trip signal directly supplied by the microcomputer, and of the trip signal passed on after a delay by the monitoring circuit, is made possible by a series circuit made up of two transistors with an electronic triggering means. It is particularly convenient to have a series circuit arrangement with two switching transistors, between which the electrical trigger means is arranged. By selecting the appropriate trigger potentials of the two switching transistors it is possible to ensure that the series circuit arrangement composed of the transistors and the trigger means is only turned on when both transistors are conducting.

In addition to the clock frequency of the microcomputer, the monitoring circuit preferably also monitors all the significant operating voltages for the functioning of the control arrangement as well. It is only when such operating voltages are within the prescribed value ranges that the enable signal may be supplied to the microcomputer.

When the monitoring circuit detects a fault, then in accordance with a preferred embodiment of the invention it supplies a drive signal to an indicator lamp, which indicates to the user of the automobile that satisfactory operation of the occupant restraint system is not being ensured. The automobile user is then requested to seek the assistance of a repair workshop for trouble shooting the fault.

A further increase in the operational reliability is achieved in the preferred embodiment of the invention since the check signal derived from the clock frequency of the microcomputer is checked in a separate evaluating circuit to see if an AC component is present. The indicator lamp is also turned on by the evaluating circuit as well, if there is no AC component present. In this manner absence of the microcomputer clock frequency also leads to an error message, if the monitoring circuit itself is subject to faulty operation and does not recognize the fault.

In order to ensure that the occurence of an fault for a brief time does not lead to the system being put out of operation, the preferred embodiment of the invention is further so designed that the monitoring circuit feeds a reset signal to the microcomputer after a fault has been detected. The microcomputer is then restarted and may resume its normal function as long as no fresh faults occur. If the fault condition should persist, the monitoring circuit will send reset pulses to the microcomputer periodically.

The monitoring circuit is preferably produced using technology resulting a substantially better voltage breakdown characteristic than the technology used for the production of the microcomputer. There is thus a strong probability of the monitoring circuit remaining unimpared if the microcomputer should be damaged by a surge in the power supply voltage.

Details of a preferred embodiment of the invention will be gathered from the following account referring to the drawing.

BRIEF DESCRIPTION OF THE DRAWING

The single FIGURE of the drawing shows a simplified block schematic of the control arrangement with its monitoring circuit.

DETAILED DESCRIPTION OF THE INVENTION

The control arrangement processes an acceleration signal produced by a piezoelectric acceleration pickup 10. The pickup is connected via a matching amplifier 12 with a signal input of a microcomputer 14, which has an A/D converter. The microcomputer is provided in a familiar manner with a central processing unit or CPU, a read only memory or ROM, a working or random access memory, RAM, and input/output circuits. The clock frequency of the microcomputer 14 is set by an external quartz oscillator 16. The power supply feeds the microcomputer 14 with a stabilized voltage Vcc.

When a certain trip criterion is fulfilled the microcomputer 14 supplies a trip signal at its terminal 18 to a blocking stage 54, whose control input is connected via a conductor 52 with the monitoring circuit 22 and whose signal output is connected with the base of a switching transistor 20. In order to ascertain whether the trip criterion is fulfilled, the microcomputer 14 evaluates or processes the acceleration signal supplied by the piezoelectric acceleration pickup 10 via the matching amplifier 12. The result of this evaluation depends, inter alia, on the correct clock frequency of the microcomputer.

For monitoring of all quantities relevant for the functioning of the control arrangement, the invention provides a monitoring circuit 22. Via its output 24, the microcomputer 14 supplies the trip signal to the monitoring circuit 22, which comprises a delay circuit, as for instance one in the form of a monovibrator, which delays the trip signal by a fixed interval of time $\tau$. The output signal of the delay circuit is supplied via conductor 26 to the base of a second switching transistor 28, which is connected in series with the switching transistor 20 by the interposition of an electric trigger means 30 between the positive pole of the supply voltage and ground. The switching transistors 20 and 28 have the opposite type of conductivity. It is only when both the switching transistors 20 and 28 are turned on that the electrical trigger means will get the necessary drive voltage to activate it.

The monitoring circuit 22 receives a check signal, via a conductor 32 derived by the microcomputer from the clock signal. This check signal is produced, for instance, in the microcomputer 14 by scaling down the clock signal from 6 MHz to 1 kHz. In the monitoring circuit 22 this check signal is evaluated and its frequency checked. This checking operation is performed by counting circuits, which require a stable clock signal. This clock signal is produced by an oscillator forming part of the monitoring circuit 22. The frequency of this oscillator is determined by a quartz oscillator 34. As long as the check circuit 22 ascertains that the frequency of the check signal is correct, it produces an enable signal, which is supplied via a conductor 36 to the microcomputer 14. A control signal corresponding to the enable signal on the conductor 36 is supplied via a conductor 52 to the blocking stage 54 to enable it to allow the drive signal to pass from the output 18 to the base of the switching transistor 20. If the control signal should be absent, the drive signal is blocked in the blocking stage 54.

In the event of a fault being detected, then together with the discontinuance of the enable signal the monitoring circuit 22 will supply a drive signal via a conductor 38 to a drive circuit 40, whose output operates a indicator lamp 42. The indicator lamp 42 is located in the immediate field of view of the user of the automobile so as to provide immediate indication of the fault.

After a fault has been indicated, the monitoring circuit 22 supplies a reset signal via a conductor 44 to the microcomputer 14. This reset signal means that microcomputer 14 is initialized and operational again, something that takes place in a short time if no further fault should occur. If the fault persists, the monitoring circuit 22 will periodically send reset signals via the conductor 44 to the microcomputer 14. In the meantime the indicator lamp 42 remains on. After becoming operational and after each resetting of the microcomputer 14, there will be no enable signal on the conductor 36 until the monitoring circuit 22 has checked all quantities and has not been able to detect any functional fault. During this interval of time the microcomputer 14 is not able to supply any trip signal.

In addition to the frequency of the check signal, the monitoring circuit 22 also monitors the voltage Vcc of the power supply. This monitoring action is performed by conventional voltage comparators. When the voltage is not within a prescribed range of for instance 4.75 to 5.25 V, a fault is recognized, the enable signal on the conductor 36 is discontinued and simultaneously the indicator lamp 42 is turned on via the drive circuit 40.

By the intermediary of a separate processing or evaluating circuit 46, the indicator lamp 42 is also turned on if the check signal coming in from the microcomputer 14 via a conductor 48, and derived from the clock frequency of the microcomputer, does not have an AC component. This check signal may be identical to the signal supplied via the conductor 32 to the monitoring circuit 22. It is produced by scaling down the clock frequency of the microcomputer. The processing circuit 46 is provided with a charge/discharge network, in which a capacitor is periodically recharged by the AC component of the check signal and on average has a charge voltage of zero. When the AC component is absent, the capacitor is on the other hand charged up to a voltage value other than zero. This charge voltage leads to the production of a drive signal for the indicator lamp 42. Thus the indicator lamp 42 is also turned on when the clock signal of the microcomputer 14 is absent and there is also a fault in the monitoring circuit 22 so that it does not detect the fault.

DESCRIPTION OF OPERATION OF CONTROL ARRANGEMENT

The acceleration pickup 10 supplies an analog acceleration signal, which is proportional to the acceleration or deceleration of the automobile. The matching amplifier 12 amplifies the acceleration signal with an amplification factor suitable for further processing in the microcomputer 14. The amplified acceleration signal is firstly digitalized in the microcomputer 14 and then evaluated. Such evaluation or processing is in accordance with a program stored in the ROM of the microcomputer 14. When a given trip criterion is fulfilled, the microcomputer 14 supplies a trip signal via its output 18 to the base of the switching transistor 20 and at the same time, via the output 24, supplies the trip signal to the delay circuit of the monitoring circuit 22. THe trip signal, delayed by a fixed time $\tau$ of for instance 682 $\mu$s, is applied via the conductor 26 to the base of the switching transistor 28. If after the elapse of the time $\tau$ the trip signal is still present at the output 18 of the microcomputer 14, the switching transistor 20 will remain turned on and the switching transistor 28 will also be turned on so that the electrical trigger means 30 will be approximately between the positive supply voltage and ground and will thus be operated.

If on the other hand during the time $\tau$ the monitoring circuit 22 should detect a fault, as for instance the wrong value for the power supply voltage Vcc or a departure from the rated frequency of the clock of the microcomputer, the enable signal, which is otherwise permanent, will no longer be supplied via the conductor 36. The blocking stage 54 blocks so that the switching transistor 20 remains turned off. The drive signal for the switching transistor 28 is not passed on by the monitoring circuit 22.

The monitoring circuit 22 always supplies the enable signal via the conductor 36 to the microcomputer 14, when there has been a reset and no fault has been detected. During reset and every time a fault occurs, neither the enable signal nor the control signal are supplied, thereby unblocking the blocking stage 54.

Simultaneously with the discontinuance of the enable signal on the conductor 36, the indicator lamp 42 is activated in the manner already described.

In an automobile environment interference in the form of voltage surges or high frequency radiation is a common occurrence. Such interference however as a rule only occurs briefly. When the monitoring circuit 22 has detected a fault, which is due to the effect of such interference, the probability will be high that subsequent operation of the microcomputer 14 free of faults will be possible. For this reason, after the occurrence of a fault, the monitoring circuit 22 supplies a reset signal via the conductor 44 to the microcomputer 14 in order to reset or initialize it. If thereafter the microcomputer does not start operating normally, the monitoring circuit 22 will continue to periodically supply reset signals via the conductor 44.

The monitoring circuit comprises units such as counters and comparators, which may be readily produced using technology which ensures a relatively high breakdown voltage; for instance the monitoring circuit 22 may be in the form of a customized integrated circuit. Provided that a suitable technology is selected for the production of the monitoring circuit 22 there will be only a very small chance of the circuit failing if the microcomputer is still operating correctly.

In order to ensure the supply of an error signal even if the microcomputer and the monitoring circuit fail, the indicator lamp 42 is also turned on via the processing circuit 46 if the check signal on the conductor 48 does not have an AC component, that is to say if there is a complete absence of the clock signal of the microcomputer.

We claim:

1. A control arrangement for the occupant restraint system of an automobile, comprising an acceleration pickup for sensing deceleration of the vehicle and providing an acceleration signal, a trip device in said occupant restraint system, a microcomputer adapted to process said acceleration signal and to supply one or more trip signals to said trip device when the result of processing of said acceleration signal fulfills a criterion for activation of the occupant restraint system, and a monitoring circuit external to said microcomputer and comprising an associated stable oscillator providing a reference signal, said monitoring circuit being adapted
   a) to monitor as to correct frequency by comparison to said reference signal a check signal derived from a clock signal of said microcomputer;
   b) to produce an enable signal, when said check signal has the correct frequency;
   c) to activate an indicating means, when the check signal is found to be incorrect; and
   d) in response to the disappearance of said enable signal, to prevent the supply of the trip signal to said trip device.

2. The control arrangement as claimed in claim 1, wherein said trip device is adapted to respond to the simultaneous presence of two of said trip signals, a first said trip signal being directly supplied by the microcomputer via a blocking stage which is external to the microcomputer and which is controlled by the monitoring circuit, and a second said trip signal being delayed in the monitoring circuit by a fixed time which suffices for the monitoring of the check signal and the blocking stage is adapted only to pass on said first trip signal when the enable signal is in existence.

3. The control arrangement as claimed in claim 2, wherein said trip device comprises a first switching transistor and a second switching transistor placed in a series circuit with an electrical trigger means, and said first trip signal supplied directly by the microcomputer is to be applied to a control electrode of said first switching transistor and said second delayed trip signal from the monitoring circuit is to be applied to a control electrode of said second switching transistor and the series circuit is arranged only to become conducting when both the trip signals are present.

4. The control arrangement as claimed in claim 1, wherein said monitoring circuit is also arranged to monitor the voltage of a power supply and to only supply said enable signal when said supply voltage is within prescribed value ranges.

5. The control arrangement as claimed in claim 1, wherein said monitoring circuit is adapted to supply a drive signal to an indicator lamp when one of a plurality of quantities monitored is at fault.

6. The control arrangement as claimed in claim 5, wherein said indicator lamp is arranged also to be operated independently of the monitoring circuit by an evaluating circuit which processes the check signal to detect the presence of an AC component and to operate the indicator lamp in the absence of an AC component.

7. The control arrangement as claimed in claim 1, wherein said monitoring circuit is adapted to supply a reset signal to the microcomputer after the detection of a fault condition.

8. The control arrangement as claimed in claim 7, wherein said monitoring circuit is adapted to supply said reset signal periodically to said microcomputer.

9. The control arrangement as claimed in claim 1, wherein said monitoring circuit is produced in a technology providing for a better breakdown voltage characteristic than the breakdown voltage of the microcomputer.

* * * * *